US012283608B2

(12) United States Patent
Imagawa

(10) Patent No.: US 12,283,608 B2
(45) Date of Patent: Apr. 22, 2025

(54) SEMICONDUCTOR DEVICE AND MANUFACTURING METHOD OF THE SAME

(71) Applicant: FUJI ELECTRIC CO., LTD., Kanagawa (JP)

(72) Inventor: Tetsutaro Imagawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 440 days.

(21) Appl. No.: 17/581,965

(22) Filed: Jan. 23, 2022

(65) Prior Publication Data
US 2022/0149150 A1 May 12, 2022

Related U.S. Application Data

(63) Continuation of application No. PCT/JP2020/048125, filed on Dec. 23, 2020.

(30) Foreign Application Priority Data

Feb. 12, 2020 (JP) ................................ 2020-021436

(51) Int. Cl.
*H01L 21/265* (2006.01)
*H01L 29/06* (2006.01)
(Continued)

(52) U.S. Cl.
CPC .... *H01L 29/0638* (2013.01); *H01L 21/26506* (2013.01); *H01L 29/41708* (2013.01); *H01L 29/7397* (2013.01)

(58) Field of Classification Search
CPC .......... H01L 29/0638; H01L 21/26506; H01L 29/41708; H01L 29/7397; H01L 29/0696;
(Continued)

(56) References Cited

U.S. PATENT DOCUMENTS 8,659,052 B2 * 2/2014 Ikeda .................. H01L 21/8249
257/370
8,748,236 B2 * 6/2014 Tanida .................. B23K 26/53
257/E29.066
(Continued)

FOREIGN PATENT DOCUMENTS

DE 112017000297 T5 11/2018
JP 2015138801 A 7/2015
(Continued)

OTHER PUBLICATIONS

International Search Report and (ISA/237) Written Opinion of the International Search Authority for International Patent Application No. PCT/JP2020/048125, issued/mailed by the Japan Patent Office on Dec. 23, 2021.
(Continued)

*Primary Examiner* — Vu A Vu

(57) ABSTRACT

Provided is a semiconductor device having a transistor portion and a diode portion, including: a drift region of a first conductivity type provided in a semiconductor substrate; an accumulation region of a first conductivity type provided on a front surface side of the semiconductor substrate with respect to the drift region in the transistor portion and the diode portion; and a first lifetime control region provided on the front surface side of the semiconductor substrate in the transistor portion and the diode portion.

24 Claims, 10 Drawing Sheets

(51) Int. Cl.
*H01L 29/417* (2006.01)
*H01L 29/739* (2006.01)

(58) Field of Classification Search
CPC ... H01L 21/8234; H01L 27/06; H01L 29/083; H01L 29/1095; H01L 29/32; H01L 29/407; H01L 29/66083; H01L 29/66477; H01L 29/78; H01L 29/861; H01L 29/868; H01L 29/66348
USPC .......................................................... 257/140
See application file for complete search history.

(56) References Cited

U.S. PATENT DOCUMENTS

| | | | | |
|---|---|---|---|---|
| 9,490,127 | B2* | 11/2016 | Kato | H01L 29/7397 |
| 9,882,037 | B2* | 1/2018 | Kono | H01L 27/0635 |
| 10,056,450 | B2* | 8/2018 | Kouno | H01L 29/6609 |
| 10,062,753 | B2* | 8/2018 | Kouno | H01L 29/32 |
| 10,170,607 | B2* | 1/2019 | Kouno | H01L 27/0664 |
| 10,256,234 | B2* | 4/2019 | Tanabe | H01L 27/0664 |
| 10,629,678 | B2 | 4/2020 | Yoshida | |
| 10,770,456 | B2 | 9/2020 | Yoshida | |
| 11,094,787 | B2 | 8/2021 | Tetsutaro | |
| 2012/0080718 | A1* | 4/2012 | Soeno | H01L 29/1095 257/140 |
| 2015/0206758 | A1 | 7/2015 | Kato | |
| 2017/0077216 | A1* | 3/2017 | Kouno | H01L 21/221 |
| 2017/0373141 | A1 | 12/2017 | Yoshida | |
| 2018/0108737 | A1* | 4/2018 | Naito | H01L 29/8613 |
| 2018/0151557 | A1* | 5/2018 | Tanabe | H01L 29/7391 |
| 2018/0182754 | A1* | 6/2018 | Naito | H01L 29/0834 |
| 2018/0350961 | A1 | 12/2018 | Naito | |
| 2018/0374948 | A1 | 12/2018 | Naito | |
| 2019/0252533 | A1 | 8/2019 | Naito | |
| 2019/0287961 | A1 | 9/2019 | Naito | |
| 2020/0152778 | A1 | 5/2020 | Naito | |

FOREIGN PATENT DOCUMENTS

| | | |
|---|---|---|
| JP | 2017011000 A | 1/2017 |
| WO | 2016204097 A1 | 12/2016 |
| WO | 2018030440 A1 | 2/2018 |
| WO | 2018052098 A1 | 3/2018 |
| WO | 2018151227 A1 | 8/2018 |
| WO | 2019142706 A1 | 7/2019 |
| WO | 2019244485 A1 | 12/2019 |

OTHER PUBLICATIONS

Office Action issued for counterpart Japanese Application No. 2022-500251, issued by the Japanese Patent Office on Mar. 28, 2023 (drafted on Mar. 22, 2023).

Office Action issued for counterpart German Application 112020003167.5, transmitted from the German Patent and Trademark Office on Oct. 11, 2024 (issued on Oct. 8, 2024).

\* cited by examiner

SEMICONDUCTOR DEVICE AND MANUFACTURING METHOD OF THE SAME

The contents of the following Japanese patent application (s) are incorporated herein by reference:
No. 2020-021436 filed in JP on Feb. 12, 2020, and
No. PCT/JP2020/048125 filed in WO on Dec. 23, 2020.

BACKGROUND

1. Technical Field

The present invention relates to a semiconductor device and a manufacturing method of the same.

2. Related Art

Conventionally, a semiconductor device having a transistor portion and a diode portion is known (see, for example, Patent Literatures 1 to 4).
[Patent Document 1]: Japanese Patent Application Publication No. 2015-138801
[Patent Document 2]: Japanese Patent Application Publication No. 2017-11000
[Patent Document 3]: WO 2018/030440
[Patent Document 4]: WO 2019/142706

DESCRIPTION OF EXEMPLARY EMBODIMENTS

Figure 1A:
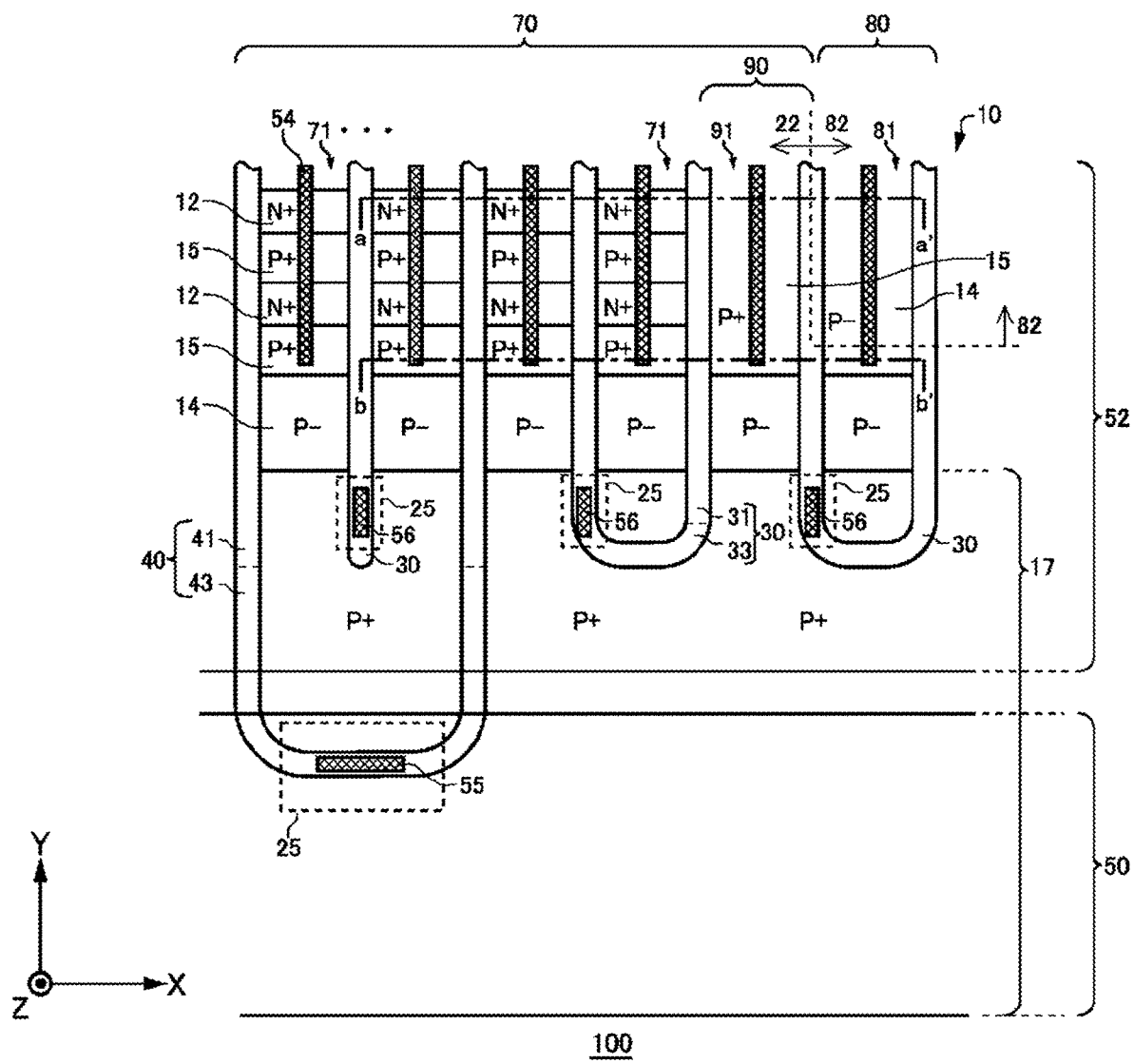
FIG. 1A illustrates an example of a top view of a semiconductor device 100 according to an embodiment.

Hereinafter, the present invention will be described through embodiments of the invention, but the following embodiments do not limit the invention according to the claims. In addition, not all combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper", "lower", "front", and "back" directions are not limited to a direction of gravity, or a direction of attachment to a substrate or the like when the semiconductor device is mounted.

In the present specification, technical matters may be described using orthogonal coordinate axes of an X axis, a Y axis, and a Z axis. In the present specification, a plane parallel to an upper surface of the semiconductor substrate is defined as an XY plane, and a depth direction of the semiconductor substrate is defined as a Z axis. In the present specification, a case where the semiconductor substrate is viewed in the Z axis direction is referred to as a plan view.

In each embodiment, an example in which a first conductivity type is an N type and a second conductivity type is a P type is shown, but the first conductivity type may be the P type and the second conductivity type may be the N type. In this case, the conductivity types of a substrate, a layer, a region, and the like in each embodiment have opposite polarities.

In the present specification, in a layer or a region denoted with n or p, it means that electrons or holes are majority carriers. In addition, + and − added to n and p mean that the doping concentration is higher and lower than that of a layer or a region to which n and p are not added, respectively, ++ means that the doping concentration is higher than +, and −− means that the doping concentration is lower than −.

In the present specification, the doping concentration refers to the concentration of the donor or acceptor dopant. Therefore, the unit is /$cm^3$. In the present specification, a concentration difference between the donor and the acceptor (that is, a net doping concentration) may be referred to as a doping concentration. In this case, the doping concentration can be measured by the srp method. In addition, the chemical concentrations of the donor and the acceptor may be the doping concentration. In this case, the doping concentration can be measured by a SIMS method. Any of the above may be used as the doping concentration unless otherwise specified. If not particularly limited, the peak value of the doping concentration distribution in the doping region may be set as the doping concentration in the doping region.

In addition, in the present specification, the dose amount refers to the number of ions per unit area where ions are implanted into the wafer when ion implantation is performed. Therefore, the unit is /$cm^2$. Note that the dose amount of the semiconductor region can be an integrated concentration obtained by integrating the doping concentration over the depth direction of the semiconductor region. The unit of the integrated concentration is /$cm^2$. Therefore, the dose amount and the integrated concentration may be treated as the same. The integrated concentration may be an integral value up to the half-value width, and in a case where the integrated concentration overlaps the spectrum of another semiconductor region, the integrated concentration may be derived excluding the influence of another semiconductor region.

Therefore, in the present specification, the level of the doping concentration can be read as the level of the dose amount. That is, in a case where the doping concentration of one region is higher than the doping concentration of the other region, it can be understood that the dose amount of the one region is higher than the dose amount of the other region.

FIG. 1A illustrates an example of a top view of a semiconductor device 100 according to an embodiment. The semiconductor device 100 of the present example is a semiconductor chip including a transistor portion 70 and a diode portion 80. For example, the semiconductor device 100 is a reverse conducting IGBT (RC-IGBT).

The transistor portion 70 is a region obtained by projecting the collector region 22 provided on the back surface side of a semiconductor substrate 10 onto the upper surface of the semiconductor substrate 10. The collector region 22 has a second conductivity type. The collector region 22 in the present example is a P+ type as an example. The transistor portion 70 includes a transistor such as an IGBT. The transistor portion 70 includes a boundary portion 90 located at a boundary between the transistor portion 70 and the diode portion 80.

The diode portion 80 is a region obtained by projecting the cathode region 82 provided on the back surface side of the semiconductor substrate 10 onto the upper surface of the semiconductor substrate 10. The cathode region 82 has a first conductivity type. The cathode region 82 of the present example is an N+ type as an example. The diode portion 80 includes a diode such as a free wheel diode (FWD) provided adjacent to the transistor portion 70 on the upper surface of the semiconductor substrate 10.

In FIG. 1A, a region around a chip end portion which is an edge side of the semiconductor device 100 is illustrated, and other regions are omitted. For example, an edge termination structure portion may be provided in a region on the negative side in the Y axis direction of the semiconductor device 100 of the present example. The edge termination structure portion reduces the electric field strength on the upper surface side of the semiconductor substrate 10. The edge termination structure portion includes, for example, a guard ring, a field plate, a RESURF, and a combination thereof. Note that, in the present example, the edge on the negative side in the Y axis direction will be described for convenience, but the same applies to the other edges of the semiconductor device 100.

The semiconductor substrate 10 may be a silicon substrate, a silicon carbide substrate, a nitride semiconductor substrate such as gallium nitride, or the like. The semiconductor substrate 10 of the present example is a silicon substrate.

The semiconductor device 100 of the present example includes a gate trench portion 40, a dummy trench portion 30, an emitter region 12, a base region 14, a contact region 15, and a well region 17 on the front surface of the semiconductor substrate 10. In addition, the semiconductor device 100 of the present example includes an emitter electrode 52 and a gate metal layer 50 provided above the front surface of the semiconductor substrate 10.

The emitter electrode 52 is provided above the gate trench portion 40, the dummy trench portion 30, the emitter region 12, the base region 14, the contact region 15, and the well region 17. The gate metal layer 50 is provided above the gate trench portion 40 and the well region 17.

The emitter electrode 52 and the gate metal layer 50 are formed of a material containing metal. For example, at least a partial region of the emitter electrode 52 may be formed of aluminum, an aluminum-silicon alloy, or an aluminum-silicon-copper alloy. At least a partial region of the gate metal layer 50 may be formed of aluminum, an aluminum-silicon alloy, or an aluminum-silicon-copper alloy. The emitter electrode 52 and the gate metal layer 50 may have a barrier metal formed of titanium, a titanium compound, or the like in a lower layer of a region formed of aluminum or the like. The emitter electrode 52 and the gate metal layer 50 are provided separately from each other.

The emitter electrode 52 and the gate metal layer 50 are provided above the semiconductor substrate 10 with an interlayer dielectric film 38 interposed therebetween. The interlayer dielectric film 38 is omitted in FIG. 1A. A contact hole 54, a contact hole 55, and a contact hole 56 are provided through the interlayer dielectric film 38.

The contact hole 55 connects the gate metal layer 50 and the gate conductive portion in the transistor portion 70. A plug made of tungsten or the like may be formed inside the contact hole 55.

The contact hole 56 connects the emitter electrode 52 and the dummy conductive portion in the dummy trench portion 30. A plug made of tungsten or the like may be formed inside the contact hole 56.

The connection portion 25 electrically connects the front surface side electrode such as the emitter electrode 52 or the gate metal layer 50 and the semiconductor substrate 10. In one example, the connection portion 25 is provided between the gate metal layer 50 and the gate conductive portion. The connection portion 25 is also provided between the emitter electrode 52 and the dummy conductive portion. The connection portion 25 is a material having conductivity, such as polysilicon doped with impurities. Here, the connection portion 25 is polysilicon (N+) doped with an N type impurity. The connection portion 25 is provided above the front surface of the semiconductor substrate 10 via a dielectric film such as an oxide film.

The gate trench portions 40 are arranged at predetermined intervals along a predetermined arrangement direction (the X axis direction in the present example). The gate trench portion 40 of the present example may include two extending portions 41 extending along an extending direction (the Y axis direction in the present example) parallel to the front surface of the semiconductor substrate 10 and perpendicular to the arrangement direction, and a connection portion 43 connecting the two extending portions 41.

It is preferable that at least a part of the connection portion 43 is formed in a curved shape. By connecting the end portions of the two extending portions 41 of the gate trench portion 40, the electric field strength at the end portion of the extending portion 41 can be reduced. The gate metal layer 50 may be connected to the gate conductive portion at the connection portion 43 of the gate trench portion 40.

The dummy trench portion 30 is a trench portion electrically connected to the emitter electrode 52. Similarly to the gate trench portion 40, the dummy trench portions 30 are arranged at predetermined intervals along a predetermined arrangement direction (the X axis direction in the present example). Similarly to the gate trench portion 40, the dummy trench portion 30 of the present example may have a U shape on the front surface of the semiconductor substrate 10. That is, the dummy trench portion 30 may include two extending portions 31 extending along the extending direction and a connection portion 33 connecting the two extending portions 31.

The transistor portion 70 of the present example has a structure in which two gate trench portions 40 and three dummy trench portions 30 are repeatedly arranged. That is, the transistor portion 70 of the present example includes the gate trench portion 40 and the dummy trench portion 30 at a ratio of 2:3. For example, the transistor portion 70 includes one extending portion 31 between the two extending portions 41. The transistor portion 70 includes two extending portions 31 adjacent to the gate trench portion 40.

However, the ratio between the gate trench portion 40 and the dummy trench portion 30 is not limited to the present example. The ratio between the gate trench portion 40 and the dummy trench portion 30 may be 1:1 or 2:4. In addition, the transistor portion 70 may have a so-called full gate structure in which the dummy trench portion 30 is not provided and the gate trench portion 40 is entirely provided.

The well region 17 is a region of the second conductivity type provided closer on the front surface side of the semiconductor substrate 10 than the drift region 18 described later. The well region 17 is an example of a well region provided on the edge side of the semiconductor device 100. The well region 17 is a P+ type as an example. The well region 17 is formed in a predetermined range from the end portion of the active region on the side where the gate metal layer 50 is provided. The diffusion depth of the well region 17 may be deeper than the depths of the gate trench portion 40 and the dummy trench portion 30. A partial region of the gate trench portion 40 and the dummy trench portion 30 on the gate metal layer 50 side is formed in the well region 17. The bottoms of the ends of the gate trench portion 40 and the dummy trench portion 30 in the extending direction may be covered with the well region 17.

The contact hole 54 is formed above each of the emitter region 12 and the contact region 15 in the transistor portion 70. In addition, the contact hole 54 is provided above the base region 14 in the diode portion 80. The contact hole 54 is provided above the contact region 15 in the boundary portion 90. The contact hole 54 is provided above the base region 14 in the diode portion 80. None of the contact holes 54 is provided above the well regions 17 provided at both ends in the Y axis direction. As described above, one or more contact holes 54 are formed in the interlayer dielectric film. One or a plurality of contact holes 54 may be provided to extend in the extending direction. A plug region 19 may be provided below the contact hole 54. The plug region 19 will be described later.

The boundary portion 90 is a region provided in the transistor portion 70 and adjacent to the diode portion 80. The boundary portion 90 includes the contact region 15. The boundary portion 90 in the present example does not include the emitter region 12. In one example, the trench portion of the boundary portion 90 is a dummy trench portion 30. The boundary portion 90 of the present example is disposed such that both ends in the X axis direction become dummy trench portions 30.

A mesa portion 71, a mesa portion 91, and a mesa portion 81 are mesa portions provided adjacent to the trench portions in a plane parallel to the front surface of the semiconductor substrate 10. The mesa portion is a portion of the semiconductor substrate 10 sandwiched between two adjacent trench portions, and may be a portion from the front surface of the semiconductor substrate 10 to the depth of the deepest bottom portion of each trench portion. The extending portion of each trench portion may be one trench portion. That is, a region sandwiched between the two extending portions may be a mesa portion.

The mesa portion 71 is provided adjacent to at least one of the dummy trench portion 30 and the gate trench portion 40 in the transistor portion 70. The mesa portion 71 includes the well region 17, the emitter region 12, the base region 14, and the contact region 15 on the front surface of the semiconductor substrate 10. In the mesa portion 71, the emitter regions 12 and the contact regions 15 are alternately provided in the extending direction.

The mesa portion 91 is provided in the boundary portion 90. The mesa portion 91 includes the contact region 15 and the well region 17 on the front surface of the semiconductor substrate 10.

The mesa portion 81 is provided in a region sandwiched between the adjacent dummy trench portions 30 in the diode portion 80. The mesa portion 81 includes the base region 14, the contact region 15, and the well region 17 on the front surface of the semiconductor substrate 10.

The base region 14 is a region of the second conductivity type provided on the front surface side of the semiconductor substrate 10 in the transistor portion 70 and the diode portion 80. The base region 14 is a P− type as an example. The base region 14 may be provided in both end portions of the mesa portion 71 and the mesa portion 91 in the Y axis direction on the front surface of the semiconductor substrate 10. FIG. A illustrates only one end portion of the base region 14 in the Y axis direction.

The emitter region 12 is a region of the first conductivity type having a higher doping concentration than the drift region 18. The emitter region 12 in the present example is an N+ type emitter region as an example. An example of the dopant of the emitter region 12 is arsenic (As). The emitter region 12 is provided in contact with the gate trench portion 40 on the front surface of the mesa portion 71. The emitter region 12 may be provided extending in the X axis direction from one of the two trench portions sandwiching the mesa portion 71 to the other portion. The emitter region 12 is also provided below the contact hole 54.

In addition, the emitter region 12 may or may not be in contact with the dummy trench portion 30. The emitter region 12 of the present example is in contact with the dummy trench portion 30. The emitter region 12 may not be provided in the mesa portion 91 of the boundary portion 90.

The contact region 15 is a region of the second conductivity type having a higher doping concentration than the base region 14. The contact region 15 of the present example is a P+ type as an example. The contact region 15 of the present example is provided in the front surfaces of the mesa portion 71 and the mesa portion 91. The contact region 15 may be provided in the X axis direction from one of the two trench portions sandwiching the mesa portion 71 or the mesa portion 91 to the other portion. The contact region 15 may or may not be in contact with the gate trench portion 40. In addition, the contact region 15 may or may not be in contact with the dummy trench portion 30. In the present example, the contact region 15 is in contact with the dummy trench portion 30 and the gate trench portion 40. The contact region 15 is also provided below the contact hole 54. Note that the contact region 15 may also be provided in the mesa portion 81.

Figure 1B:
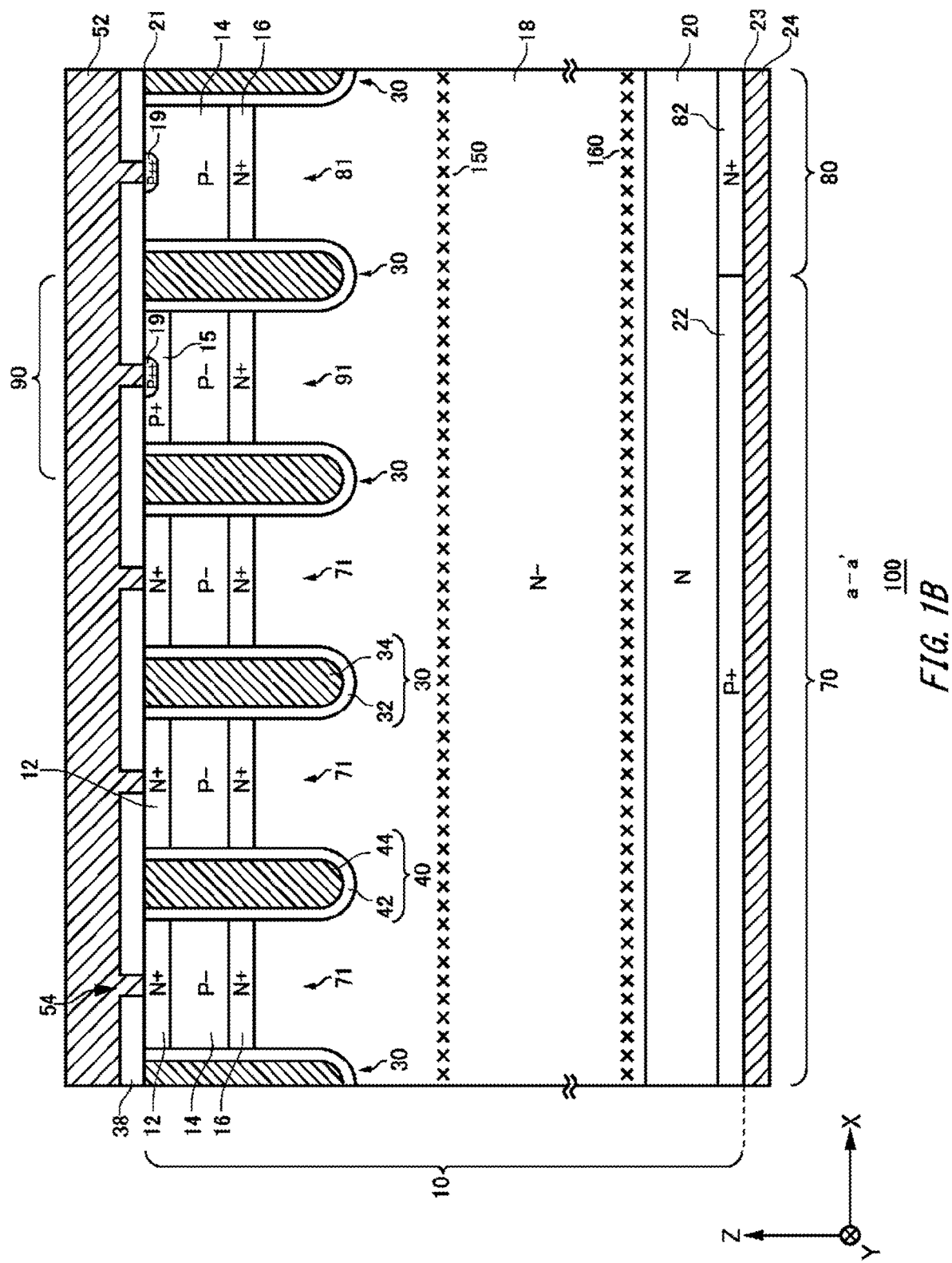
FIG. 1B is a diagram illustrating an example of a cross section taken along line a-a' in FIG. 1A.

FIG. 1B is a diagram illustrating an example of a cross section taken along line a-a' in FIG. 1A. The a-a' cross section is an XZ plane passing through the emitter region 12 in the transistor portion 70. The semiconductor device 100 of the present example includes the semiconductor substrate 10, the interlayer dielectric film 38, the emitter electrode 52, and a collector electrode 24 in the a-a' cross section. The emitter electrode 52 is formed above the semiconductor substrate 10 and the interlayer dielectric film 38.

The drift region 18 is a region of the first conductivity type provided in the semiconductor substrate 10. The drift region 18 in the present example is of N− type as an example. The drift region 18 may be a region which remains without another doping region formed in the semiconductor substrate 10. That is, the doping concentration of the drift region 18 may be the doping concentration of the semiconductor substrate 10.

The buffer region 20 is a region of the first conductivity type provided below the drift region 18. The buffer region 20 of the present example is an N type as an example. The doping concentration of the buffer region 20 is higher than the doping concentration of the drift region 18. The buffer region 20 may function as a field stop layer that prevents a depletion layer spreading from the lower surface side of the base region 14 from reaching the collector region 22 of the second conductivity type and the cathode region 82 of the first conductivity type.

The collector region 22 is provided below the buffer region 20 in the transistor portion 70. The cathode region 82 is provided below the buffer region 20 in the diode portion 80. A boundary between the collector region 22 and the cathode region 82 is a boundary between the transistor portion 70 and the diode portion 80.

The collector electrode 24 is formed on a back surface 23 of the semiconductor substrate 10. The collector electrode 24 is formed of a conductive material such as metal.

The base region 14 is a region of the second conductivity type provided above the drift region 18 in the mesa portion 71, the mesa portion 91, and the mesa portion 81. The base region 14 is provided in contact with the gate trench portion 40. The base region 14 may be provided in contact with the dummy trench portion 30.

The emitter region 12 is provided between the base region 14 and the front surface 21 in the mesa portion 71. The emitter region 12 is provided in contact with the gate trench portion 40. The emitter region 12 may or may not be in contact with the dummy trench portion 30. The emitter region 12 may not be provided in the mesa portion 91.

The contact region 15 is provided above the base region 14 in the mesa portion 91. The contact region 15 is provided in contact with the gate trench portion 40 in the mesa portion 91. In another cross section, the contact region 15 may be provided in the front surface 21 of the mesa portion 71.

The plug region 19 is a region of the second conductivity type having a higher doping concentration than the contact region 15. The plug region 19 of the present example is a P++ type as an example. The plug region 19 of the present example is provided in the front surface 21. In the mesa portion 91, the plug region 19 is provided above the contact region 15. In the mesa portion 81, the plug region 19 is provided above the base region 14. The plug region 19 may be provided to extend in the Y axis direction along the contact hole 54 in the mesa portion 91 and the mesa portion 81.

The accumulation region 16 is a region of the first conductivity type provided closer to the front surface 21 side of the semiconductor substrate 10 than the drift region 18. The accumulation region 16 of the present example is an N+ type as an example. The accumulation region 16 is provided in the transistor portion 70 and the diode portion 80. The accumulation region 16 of the present example is also provided in the boundary portion 90. As a result, the semiconductor device 100 can avoid the mask deviation of the accumulation region 16.

The accumulation region 16 is provided in contact with the gate trench portion 40. The accumulation region 16 may or may not be in contact with the dummy trench portion 30. The doping concentration of the accumulation region 16 is higher than the doping concentration of the drift region 18. The dose amount of ion implantation of the accumulation region 16 may range from 1E12 cm$^{-2}$ to 1E13 cm$^{-2}$. In addition, the dose amount of ion implantation of the accumulation region 16 may range from 3E12 cm$^{-2}$ to 6E12 cm$^{-2}$. By providing the accumulation region 16, the carrier injection enhancement effect (IE effect) can be enhanced, and the ON voltage of the transistor portion 70 can be reduced. Note that E means a power of 10, and for example, 1E12 cm$^{-2}$ means $1 \times _{10}{}^{12}$ cm$^{-2}$.

One or more gate trench portions 40 and one or more dummy trench portions 30 are provided in the front surface 21. Each trench portion is provided from the front surface 21 to the drift region 18. In a region where at least one of the emitter region 12, the base region 14, the contact region 15, and the accumulation region 16 is provided, each trench portion also penetrates these regions and reaches the drift region 18. The trench portion penetrating the doping region is not limited to those manufactured in the order of forming the doping region and then forming the trench portion. A case where a doping region is formed between the trench portions after the trench portion is formed is also included in a case where the trench portion penetrates the doping region.

The gate trench portion 40 includes a gate trench formed in the front surface 21, a gate dielectric film 42, and a gate conductive portion 44. The gate dielectric film 42 is formed to cover the inner wall of the gate trench. The gate dielectric film 42 may be formed by oxidizing or nitriding the semiconductor in the inner wall of the gate trench. The gate conductive portion 44 is formed inside the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered with the interlayer dielectric film 38 in the front surface 21.

The gate conductive portion 44 includes a region facing the base region 14 adjacent on the mesa portion 71 side with the gate dielectric film 42 interposed therebetween in the depth direction of the semiconductor substrate 10. When a predetermined voltage is applied to the gate conductive portion 44, a channel is formed by an inversion layer of electrons in a surface layer of an interface in contact with the gate trench in the base region 14.

The dummy trench portion 30 may have the same structure as the gate trench portion 40. The dummy trench portion 30 includes a dummy trench formed on the front surface 21 side, a dummy dielectric film 32, and a dummy conductive portion 34. The dummy dielectric film 32 is formed to cover the inner wall of the dummy trench. The dummy conductive portion 34 is formed inside the dummy trench and is formed inside the dummy dielectric film 32. The dummy dielectric film 32 insulates the dummy conductive portion 34 from the semiconductor substrate 10. The dummy trench portion 30 is covered with the interlayer dielectric film 38 in the front surface 21.

The interlayer dielectric film 38 is provided in the front surface 21. The emitter electrode 52 is provided above the interlayer dielectric film 38. The interlayer dielectric film 38 is provided with one or more contact holes 54 for electrically connecting the emitter electrode 52 and the semiconductor substrate 10. Similarly, the contact hole 55 and the contact hole 56 may be provided through the interlayer dielectric film 38.

The lifetime control region 150 is a region in which a lifetime killer is intentionally formed by, for example, implanting impurities into the semiconductor substrate 10. The lifetime killer is the recombination center of the carrier. The lifetime killer may be a crystal defect. For example, the lifetime killer may be a vacancy, a divacancy, a defect complex of these and an element constituting the semiconductor substrate 10, or a dislocation. In addition, the lifetime killer may be a rare gas element such as helium or neon, a metal element such as platinum, or the like. A lifetime control region 150 can be formed by implanting helium or the like into the semiconductor substrate 10.

The lifetime control region 150 is provided on the front surface 21 side of the semiconductor substrate 10. The lifetime control region 150 is provided in both the transistor portion 70 and the diode portion 80. The lifetime control region 150 may be formed by implanting impurities from the front surface 21 side or may be formed by implanting impurities from the back surface 23 side. The lifetime control region 150 is an example of a first lifetime control region provided on the front surface 21 side.

The lifetime control region 150 of the present example is provided in the entire surface of the semiconductor substrate 10. Therefore, the lifetime control region 150 can be formed without using a mask. The dose amount of impurities for forming the lifetime control region 150 may range from $0.5\mathrm{E}10\ \mathrm{cm}^{-2}$ to $1\mathrm{E}13\ \mathrm{cm}^{-2}$. The dose amount of impurities for forming the lifetime control region 150 may range from $5\mathrm{E}10\ \mathrm{cm}^{-2}$ to $5\mathrm{E}11\ \mathrm{cm}^{-2}$.

In addition, the lifetime control region 150 of the present example is formed by implantation from the back surface 23 side. For example, the lifetime control region 150 is formed by irradiating helium from the back surface 23 side. This makes it possible to avoid an influence on the front surface 21 side of the semiconductor device 100. Whether the lifetime control region 150 is formed by the implantation from the front surface 21 side or the implantation from the back surface 23 side can be determined by acquiring the state of the front surface 21 side by the srp method or the measurement of the leakage current.

A lifetime control region 160 is provided on the back surface 23 side of the semiconductor substrate 10. The lifetime control region 160 is provided in both the transistor portion 70 and the diode portion 80. The lifetime control region 160 is provided closer to the front surface 21 side than the buffer region 20. The lifetime control region 160 may be provided in the buffer region 20.

The lifetime control region 160 is provided on the entire back surface 23 side of the semiconductor substrate 10. That is, the lifetime control region 160 can be formed without using a mask. The lifetime control region 160 may be formed by any one of methods for forming the lifetime control region 150. It may be formed by implanting impurities from the back surface 23 side of the semiconductor substrate 10. The lifetime control region 160 is an example of a second lifetime control region provided on the back surface 23 side of the semiconductor substrate 10.

Figure 1C:
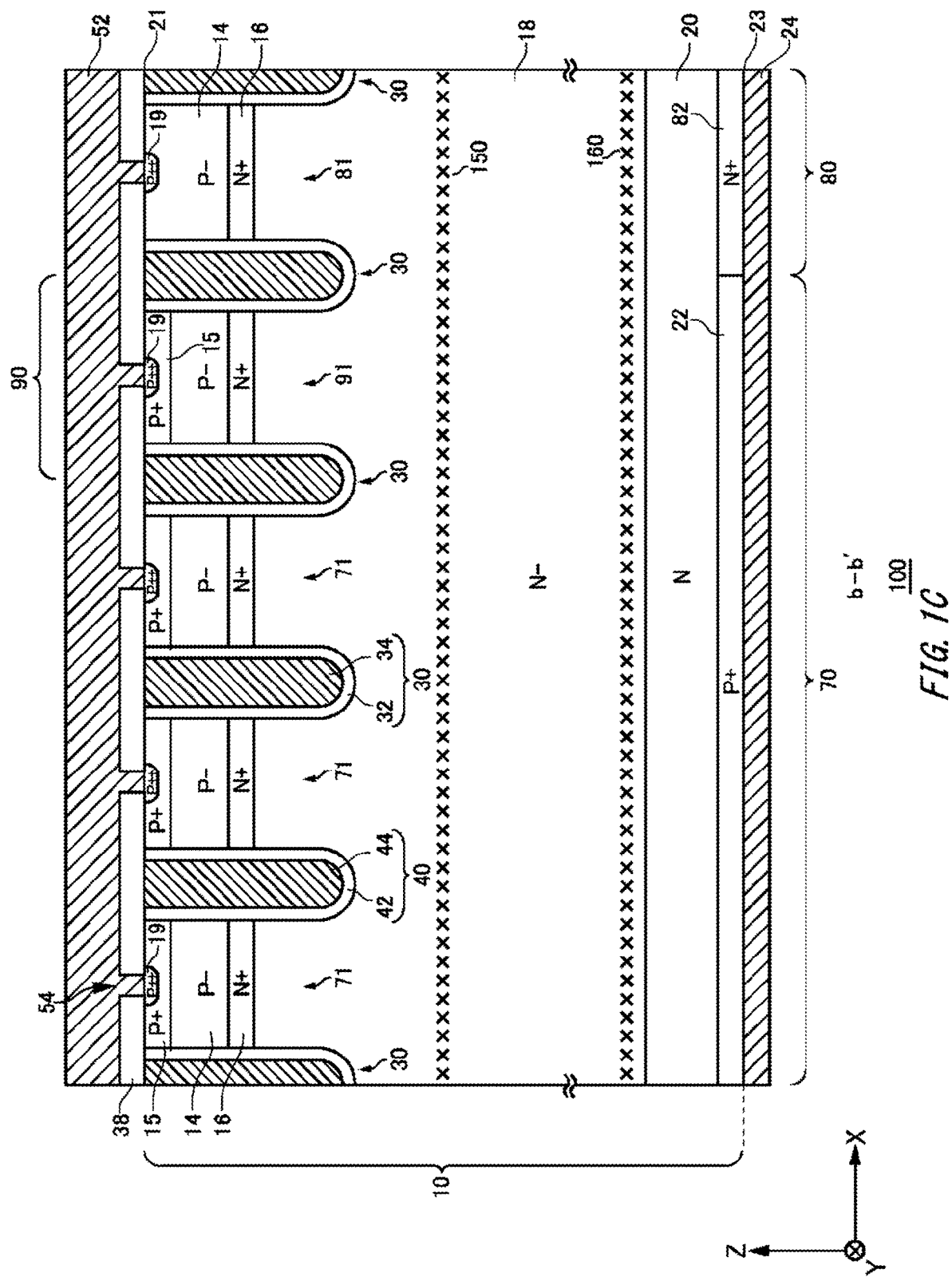
FIG. 1C is a diagram illustrating an example of a cross section taken along line b-b' in FIG. 1A.

FIG. 1C is a diagram illustrating an example of a cross section taken along line b-b' in FIG. 1A. The b-b' cross section is an XZ plane passing through the contact region 15 in the transistor portion 70.

The mesa portion 71 includes the base region 14, the contact region 15, the accumulation region 16, and the plug region 19. By providing the plug region 19, the RBSOA (reverse bias safe operation region) withstand capability is improved. As in the case of the a-a' cross section, the mesa portion 91 includes the base region 14, the contact region 15, the accumulation region 16, and the plug region 19. In the b-b' cross section, the mesa portion 71 has the same structure as the mesa portion 91. As in the case of the a-a' cross section, the mesa portion 81 includes the base region 14, the accumulation region 16, and the plug region 19.

The lifetime control region 150 and the lifetime control region 160 are provided in both the transistor portion 70 and the diode portion 80 as in the case of the a-a' cross section.

Since the semiconductor device 100 of the present example includes the lifetime control region 150 in both the transistor portion 70 and the diode portion 80, the holes are uniformly removed at the time of turn-off, and the carrier balance between the transistor portion 70 and the diode portion 80 is improved. Then, the RBSOA withstand capability and the short-circuit withstand capability are improved, and the latch-up withstand capability is also improved.

Figure 2A:
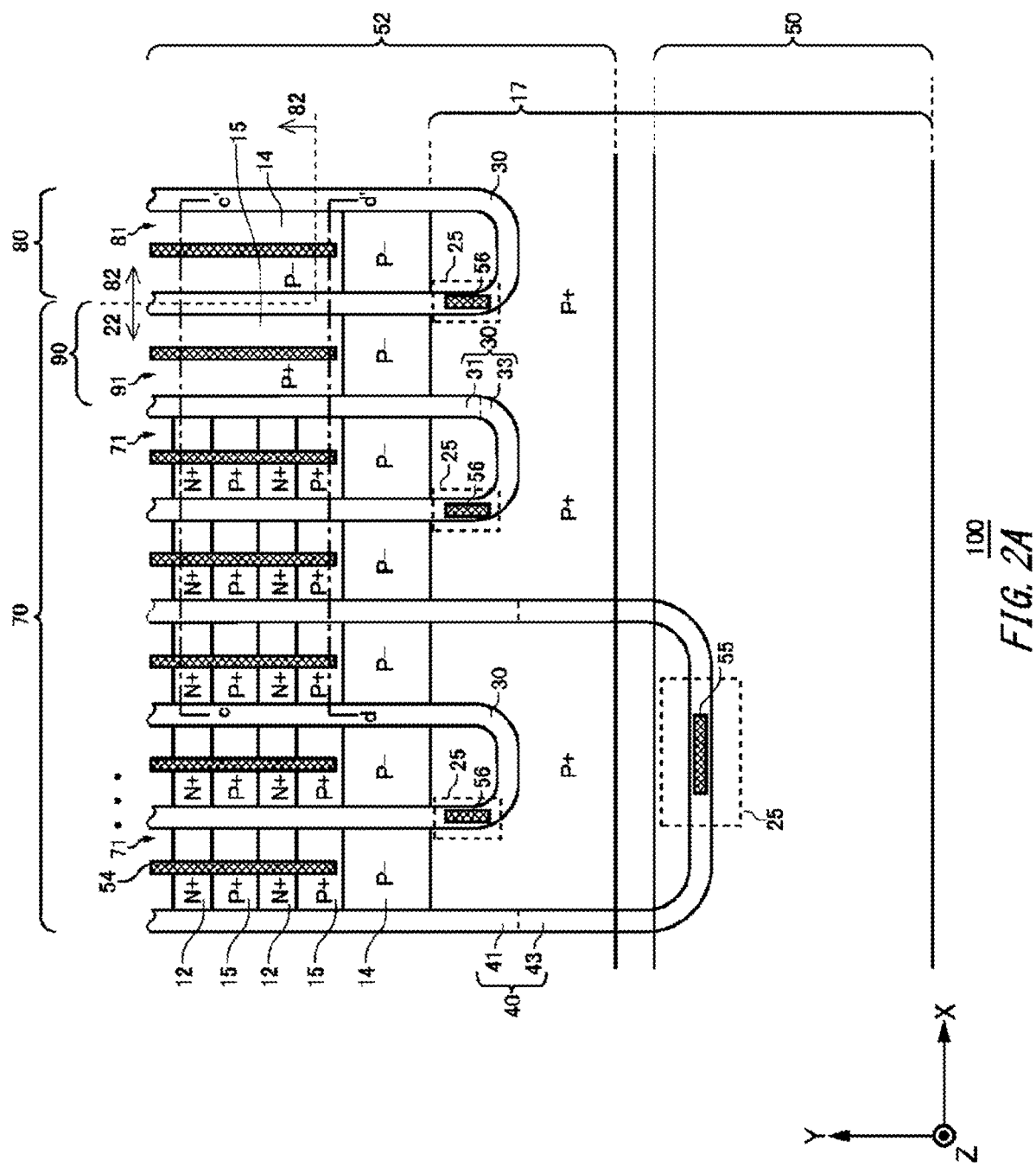
FIG. 2A illustrates an example of a top view of the semiconductor device 100 according to an embodiment.

FIG. 2A illustrates an example of a top view of the semiconductor device 100 according to an embodiment. In the semiconductor device 100 of the present example, the arrangement of the dummy trench portion 30 and the gate trench portion 40 is different from that of the semiconductor device 100 of FIG. 1A. In the present example, points different from the embodiment of FIG. 1A will be particularly described. In the present example, the ratio of the dummy trench portion 30 is larger than that in the embodiment of FIG. 1A.

In the transistor portion 70, the gate trench portion 40 and the dummy trench portion 30 are repeatedly arranged such that the ratio between the gate trench portion 40 and the dummy trench portion 30 is 2:4. A set of dummy trench portions 30 connected by the connection portion 33 is provided inside a set of gate trench portions 40 connected by the connection portion 43.

Figure 2B:
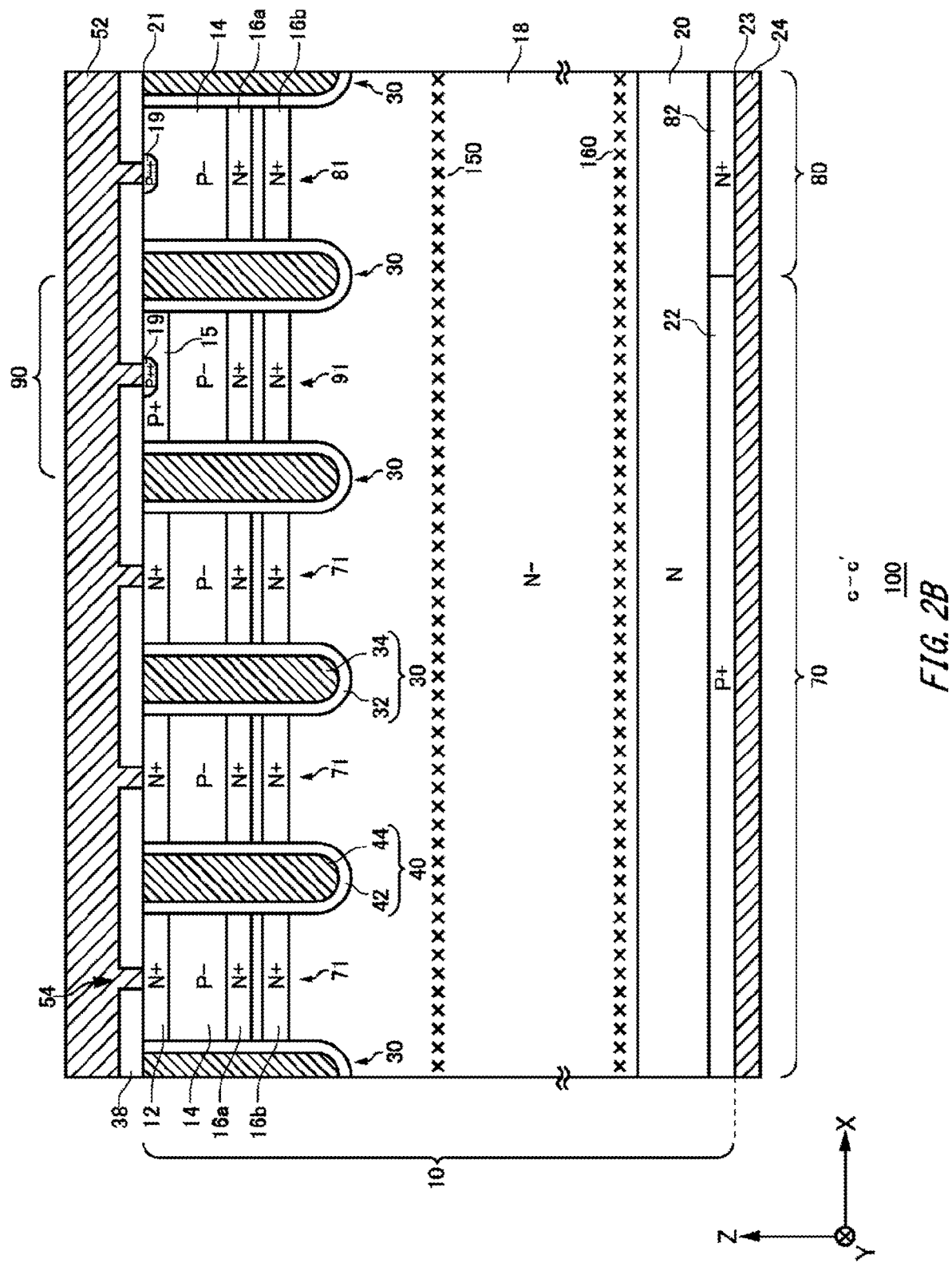
FIG. 2B is a diagram illustrating an example of a cross section taken along line c-c' in FIG. 2A.

FIG. 2B is a diagram illustrating an example of a cross section taken along line c-c' in FIG. 2A. The c-c' cross section is an XZ plane passing through the emitter region 12 in the transistor portion 70. The semiconductor device 100 of the present example is different from the semiconductor device 100 of FIG. 1B in that a two-stage accumulation region 16 made of an accumulation region 16a and an accumulation region 16b is included. In the present example, points different from the embodiment of FIG. 1B will be particularly described.

The accumulation region 16a and the accumulation region 16b are provided in both the transistor portion 70 and the diode portion 80. The doping concentrations of the accumulation region 16a and the accumulation region 16b may be the same or different. The doping concentration of the accumulation region 16a may be larger or smaller than the doping concentration of the accumulation region 16b. The doping concentration of the accumulation region 16 may refer to a peak value of the doping concentration of each accumulation region 16.

The accumulation region 16a is a first accumulation region provided closer to the front surface 21 side than the drift region 18. The accumulation region 16a is provided below the base region 14. In one example, the dose amount of ion implantation in the accumulation region 16a ranges from $1\mathrm{E}12\ \mathrm{cm}^{-2}$ to $1\mathrm{E}13\ \mathrm{cm}^{-2}$. For example, the accumulation region 16a is formed with a dose amount of $3\mathrm{E}12\ \mathrm{cm}^{-2}$ and an acceleration energy of 2.6 MeV.

The accumulation region 16b is a second accumulation region provided below the accumulation region 16a. In one example, the dose amount of ion implantation in the accumulation region 16b ranges from $1\mathrm{E}12\ \mathrm{cm}^{-2}$ to $1\mathrm{E}13\ \mathrm{cm}^{-2}$. For example, the accumulation region 16b is formed with a dose amount of $3\mathrm{E}12\ \mathrm{cm}^{-2}$ and an acceleration energy of 3.9 MeV. The drift region 18 may be provided between the accumulation region 16a and the accumulation region 16b. Note that the semiconductor device 100 of the present example includes the accumulation regions 16 in two stages, but may include the accumulation regions 16 in three or more stages.

Figure 2C:
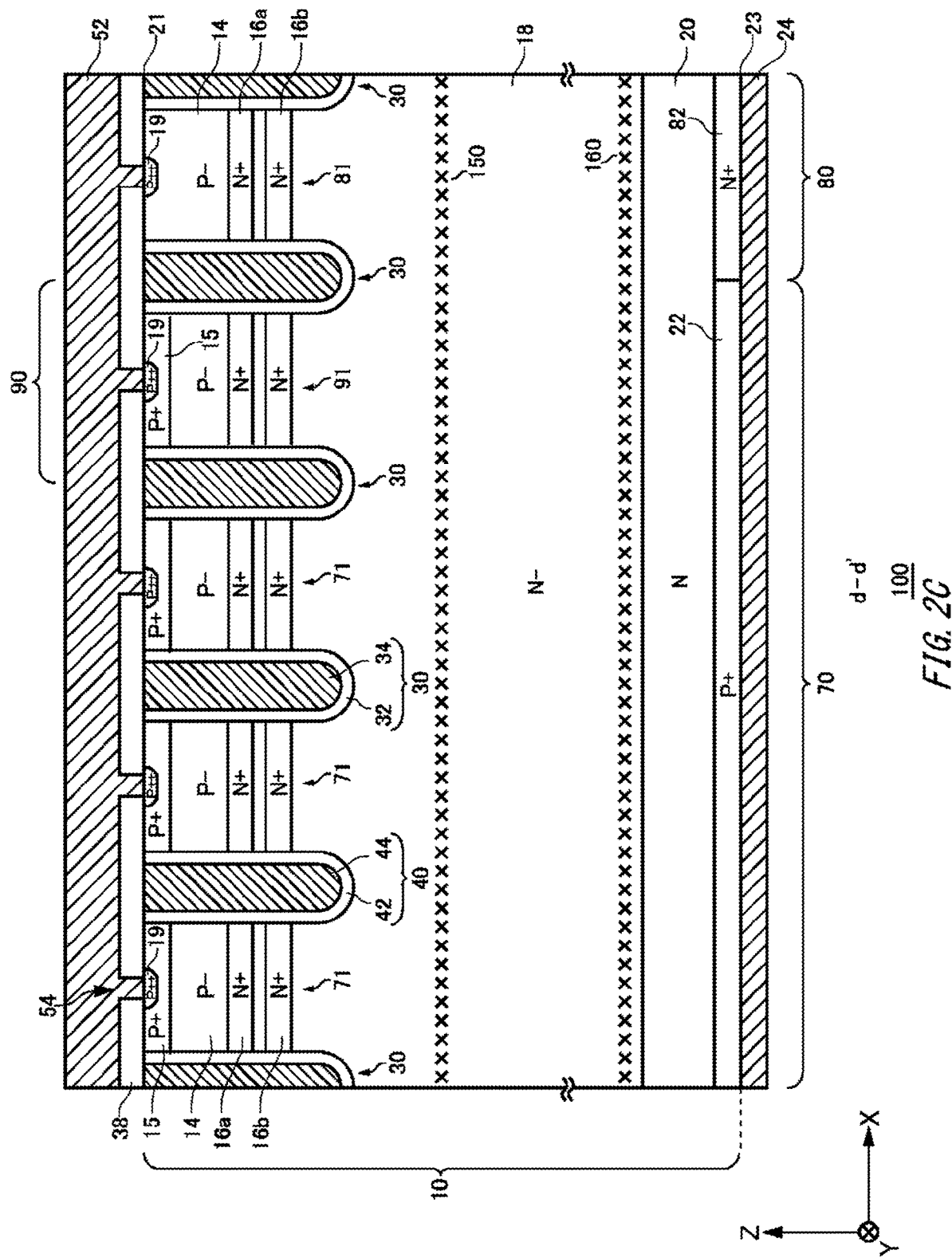
FIG. 2C is a diagram illustrating an example of a cross section taken along line d-d' in FIG. 2A.

FIG. 2C is a diagram illustrating an example of a cross section taken along line d-d' in FIG. 2A. The d-d' cross section is an XZ plane passing through the contact region 15 in the transistor portion 70. The semiconductor device 100 of the present example is different from the semiconductor device 100 of FIG. 1C in that the accumulation region 16a and the accumulation region 16b are included. In the present example, points different from the example of FIG. 1C will be particularly described.

The accumulation region 16a and the accumulation region 16b are provided in both the transistor portion 70 and the diode portion 80 similarly to the c-c' cross section. The accumulation region 16a and the accumulation region 16b may be provided under conditions similar to those of the c-c' cross section.

By providing the accumulation region 16 in two stages, the IE effect in the semiconductor device 100 is improved, so that the ON-resistance of the transistor portion 70 is easily reduced. In addition, the semiconductor device 100 can suppress a decrease in withstand capability by providing the lifetime control region 150 on the entire surface. Therefore, the semiconductor device 100 of the present example can suppress a decrease in withstand capability while reducing the ON-resistance.

Figure 2D:
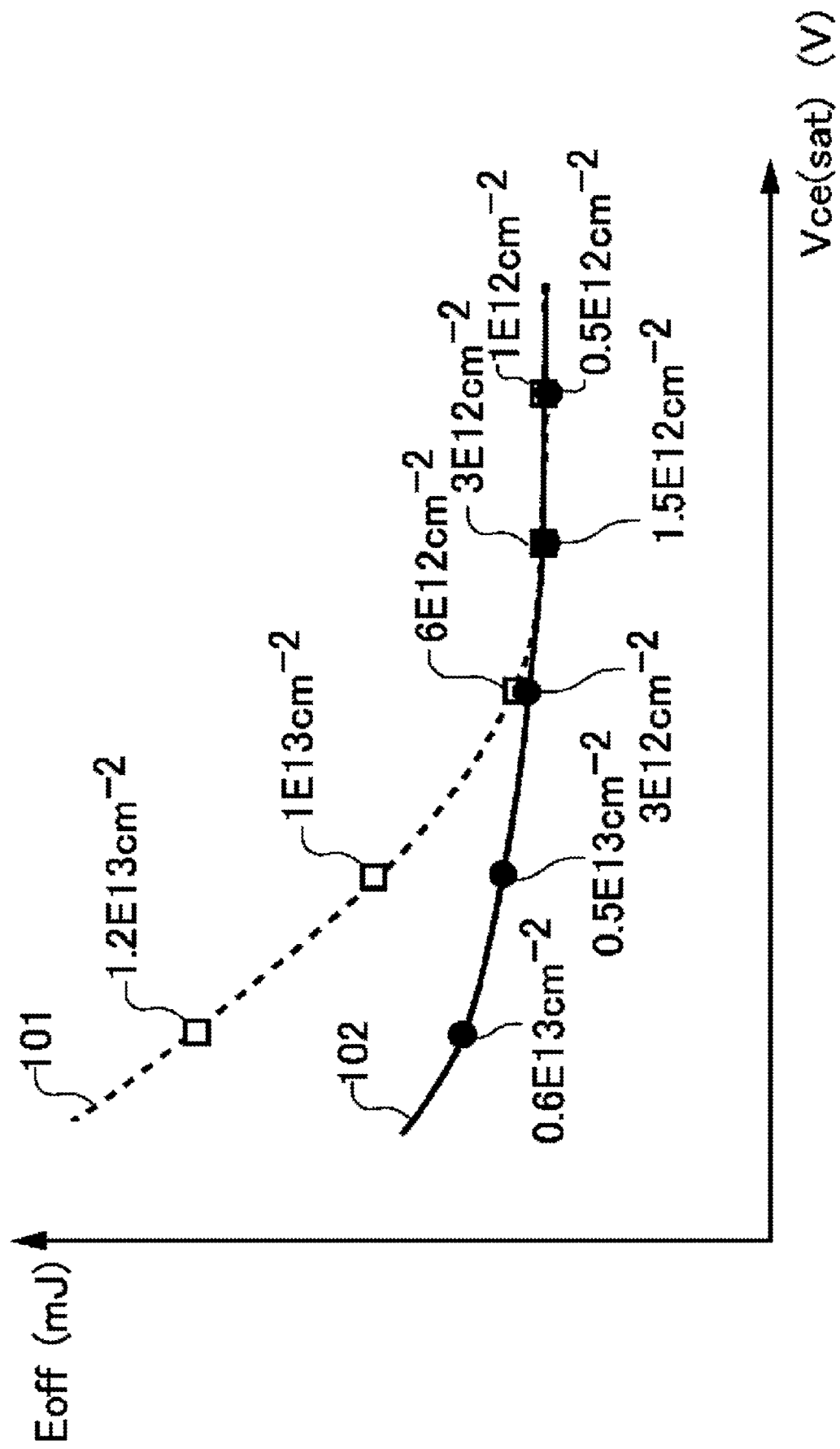
FIG. 2D is a diagram for explaining a difference in characteristics depending on the number of stages of an accumulation region 16.

FIG. 2D is a diagram for explaining a difference in characteristics depending on the number of stages of the accumulation region 16. The vertical axis represents a turn-off loss Eoff (mJ), and the horizontal axis represents a collector-emitter saturation voltage Vce(sat) (V).

A curve 101 indicates a characteristic in a case where the accumulation region 16 has one stage. That is, the curve 101 corresponds to the semiconductor device 100 in FIG. 1A to FIG. 1C. A curve 102 indicates a characteristic in a case where the accumulation region 16 has two stages. The curve 102 corresponds to the semiconductor device 100 in FIG. 2A to FIG. 2C.

The doping concentration is set such that the sum of the doping concentrations of the accumulation region 16a and the accumulation region 16b in two stages is equal to the doping concentration of the accumulation region 16 in the case of one stage. In addition, the doping concentration of the accumulation region 16a is the same as the doping concentration of the accumulation region 16b. For example, in a case where the doping concentration of the accumulation region 16 in one stage is 1E12 cm$^{-3}$, the doping concentration in the corresponding two stages is 0.5E12 cm$^{-3}$. In the drawing, the doping concentration corresponding to each plot is described. The plot of the present example shows the case where the doping concentration of the accumulation region 16 is 1E12 cm$^{-3}$, 3E12 cm$^{-3}$, 6E12 cm$^{-3}$, 1E13 cm$^{-3}$ and 1.2E13 cm$^{-3}$, respectively.

The collector-emitter saturation voltage Vce(sat) tends to decrease as the doping concentration of the accumulation region 16 increases. However, in a region where the doping concentration of the accumulation region 16 is large, the turn-off loss Eoff tends to increase due to the IE effect.

In a region where the collector-emitter saturation voltage Vce(sat) is relatively large, the curve 101 and the curve 102 overlap each other, and the difference in characteristics is small. On the other hand, in a region where the collector-emitter saturation voltage Vce(sat) is relatively small, the turn-off loss Eoff of the curve 102 is smaller than that of the curve 101.

Therefore, in the semiconductor device 100, a case where the accumulation region 16 has a two-stage configuration easily reduces the turn-off loss Eoff while suppressing the collector-emitter saturation voltage Vce(sat). In addition, in the semiconductor device 100, a case where the accumulation region 16 has the two-stage configuration can increase the doping concentration of the accumulation region 16 without increasing the turn-off loss Eoff.

Figure 3:
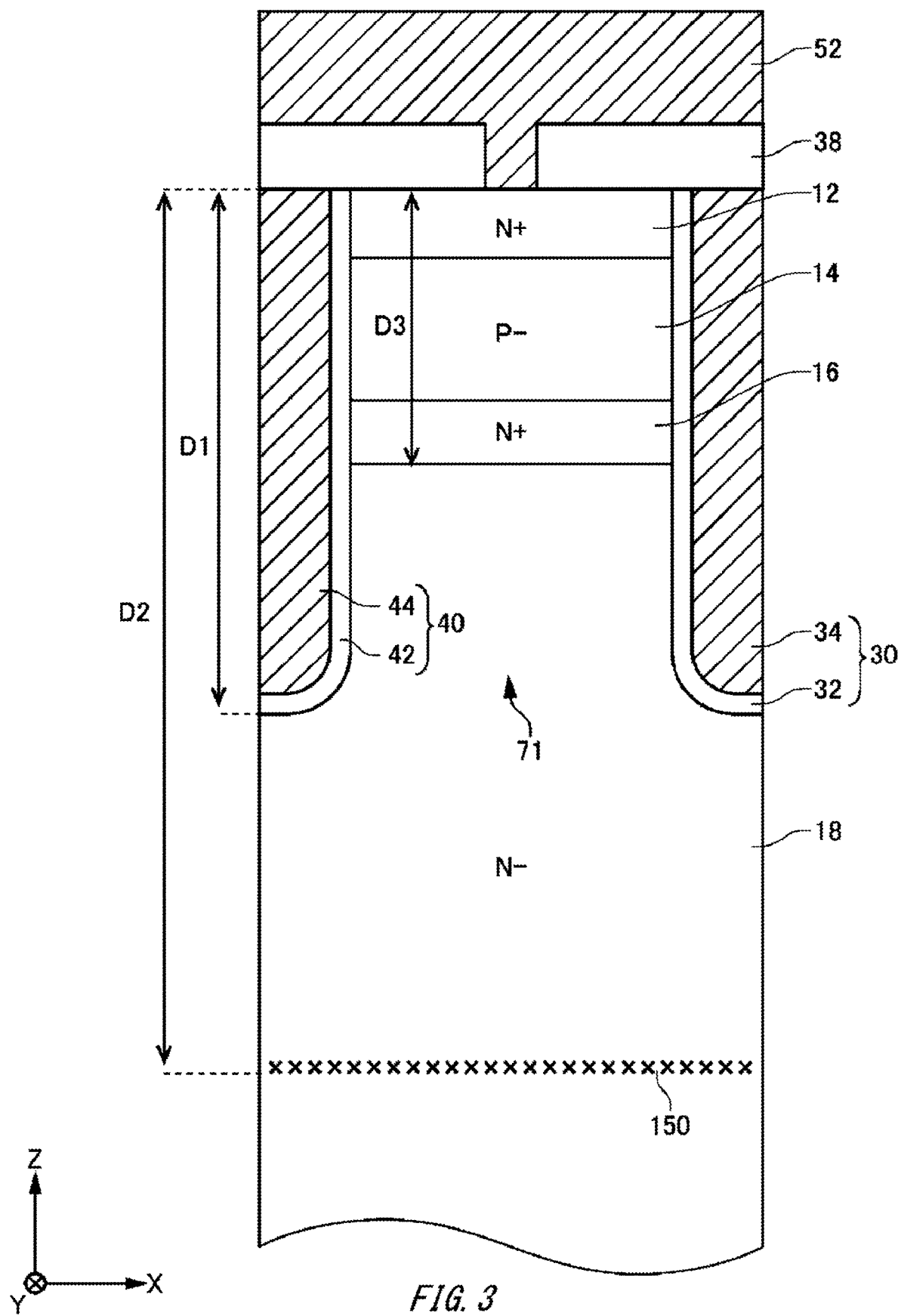
FIG. 3 is an example of an enlarged sectional view of the vicinity of a mesa portion 71.

FIG. 3 is an example of an enlarged sectional view of the vicinity of the mesa portion 71. In the present example, the mesa portion 71 sandwiched between the dummy trench portion 30 and the gate trench portion 40 is illustrated.

A depth D1 is the depth of the trench of the dummy trench portion 30 or the gate trench portion 40. The depth D1 may be the depth of the lower end of the dummy dielectric film 32 or the gate dielectric film 42. The depth D1 is appropriately set according to characteristics and the like of the semiconductor device 100.

A depth D2 is the depth of the lifetime control region 150 from the front surface 21. The depth D2 in the present example is deeper than the depth D1. That is, the lifetime control region 150 is provided below the dummy trench portion 30 and the gate trench portion 40. For example, the depth D2 rages from 5 µm to 20 µm.

A depth D3 is the depth of the accumulation region 16 from the front surface 21. In one example, the depth D3 is the depth of the lower end of the accumulation region 16. In a case where the accumulation region 16 has a plurality of stages, the depth D3 may be the depth of the lower end of the accumulation region 16 provided at the lowermost position. The depth of the lower end of the accumulation region 16 is the depth of the boundary between the accumulation region 16 and the drift region 18. That is, the lower end of the accumulation region 16 is a position where the doping concentration of the accumulation region 16 becomes the doping concentration of the drift region 18. Further, the depth D3 may be the depth of the peak position of the doping concentration of the accumulation region 16. For example, the depth D3 ranges from 1 µm to 5 µm. In one example, the depth D3 is 3 µm.

The depth D2 is deeper than the depth D1. The depth D2 may be deeper than twice the depth D3. In this case, a gap equal to or greater than the depth D3 is provided between the lifetime control region 150 and the accumulation region 16. As described above, by providing the gap between the lifetime control region 150 and the accumulation region 16, the withstand capability can be improved by the lifetime control region 150 without sacrificing the effect of reducing the ON-resistance by the accumulation region 16.

The depth of the lifetime control region 150 from the front surface 21 is within 20 µm. In one example, the depth from the front surface 21 of the lifetime control region 150 is 10 µm.

The depth D3 is within the trench depth of the trench portion. The case within the trench depth includes a case of the same depth as the trench depth and a case of being shallower than the trench depth. The accumulation region 16 may not be provided at a position deeper than the trench portion. That is, Depth D3 being less than or equal to Depth D1 holds.

Figure 4:
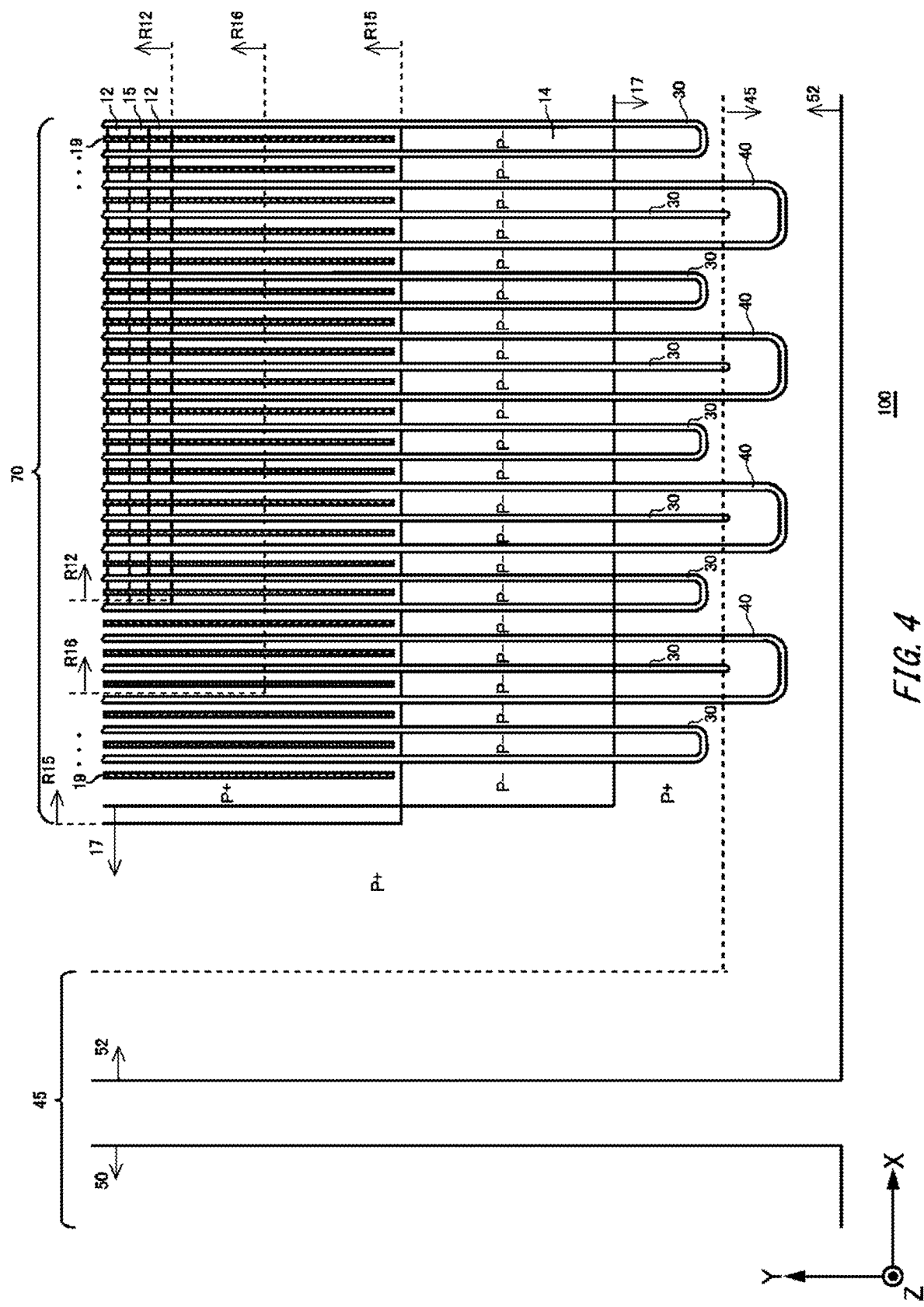
FIG. 4 illustrates an example of a top view of a chip end portion of the semiconductor device 100.

FIG. 4 illustrates an example of a top view of the chip end portion of the semiconductor device 100. In the present example, a top view of the negative end portion of the emitter electrode 52 in the X axis direction and the Y axis direction is illustrated.

The emitter electrode 52 is provided so as to cover the dummy trench portion 30 and the gate trench portion 40. The gate trench portion 40 of the present example is electrically connected to the gate metal layer 50 via a gate runner 45.

The gate runner 45 electrically connects the gate metal layer 50 and the gate trench portion 40 via a contact hole provided in the interlayer dielectric film 38. The gate runner 45 of the present example is electrically connected to the gate conductive portion 44 in the front surface 21. The gate runner 45 is not connected to the dummy conductive portion in the dummy trench portion 30. For example, the gate runner 45 is formed of polysilicon doped with impurities or the like.

A region R12 indicates a region where the emitter region 12 and the contact region 15 are repeatedly provided. That is, the emitter region 12 does not need to be provided in the entire surface of the region R12. The outer periphery of the region R12 is defined by the emitter region 12 provided on the outermost side in a plan view. For example, the region R12 functions as an active region through which the main current of the transistor portion 70 flows.

A region R16 is a region where the accumulation region 16 is provided. In the region R16, the accumulation region 16 may be provided in the entire surface. However, even in the region R16, the accumulation region 16 may not be provided in the region where the dummy trench portion 30 and the gate trench portion 40 are provided. The region R16 of the present example is provided in a wider range than the region R12 in a plan view.

A region R15 is a region where the contact region 15 is provided. The region R15 may include a region where the emitter region 12 and the contact region 15 are repeatedly provided like the region R12. The plug region 19 may be repeatedly provided in the region R15.

In the semiconductor device 100 of the present example, the region R16 is provided so as to cover the region R12. As a result, the active region of the transistor portion 70 is less likely to be affected by the mask deviation of the accumulation region 16. Further, in the semiconductor device 100, the region R15 is provided so as to cover the region R16. Furthermore, the lifetime control region 150 is provided such that the lifetime control region 150 covers the region R15, whereby the influence of the mask deviation of the lifetime control region 150 can be avoided. In a case where the lifetime control region 150 is provided in the entire surface of the semiconductor substrate 10, the influence of the mask deviation of the lifetime control region 150 does not occur.

Figure 5:
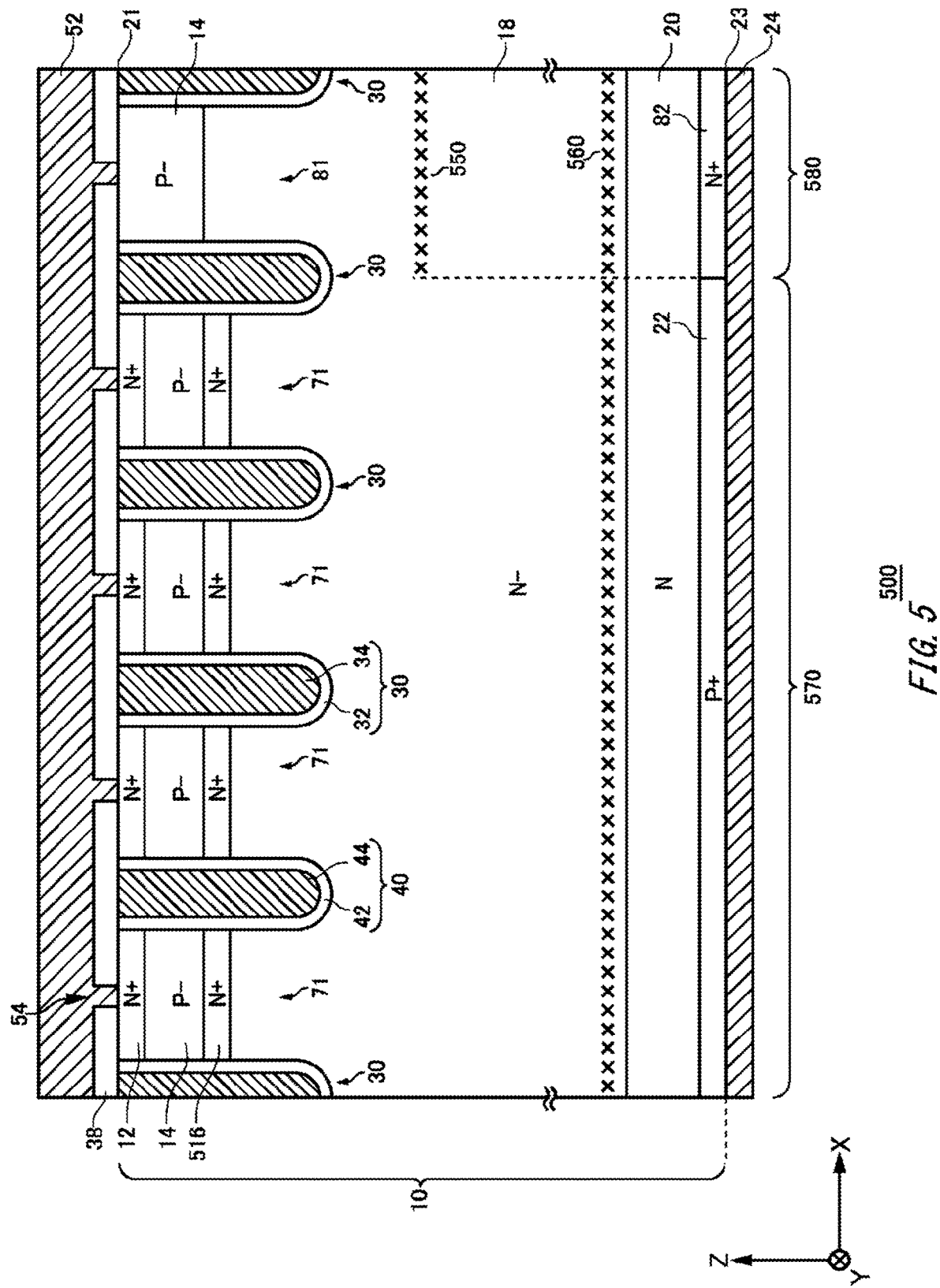
FIG. 5 is an example of a sectional view of a semiconductor device 500 according to a comparative example

FIG. 5 is an example of a sectional view of a semiconductor device 500 according to a comparative example. In the present example, a sectional view of a boundary portion between a transistor portion 570 and a diode portion 580 included in the semiconductor device 500 is illustrated.

The semiconductor device 500 includes an accumulation region 516 in the transistor portion 570. The semiconductor device 500 does not include the accumulation region 516 in the diode portion 580, and may be affected by the mask deviation of the accumulation region 516.

In addition, the semiconductor device 500 includes a lifetime control region 550 provided on the front surface 21 side of the semiconductor substrate 10. The semiconductor device 500 includes a lifetime control region 560 provided on the back surface 23 side of the semiconductor substrate 10.

The lifetime control region 550 is provided in the diode portion 580 but is not provided in the transistor portion 570. That is, the lifetime control region 550 is formed by partial irradiation instead of entire irradiation of impurities. For partial irradiation of the lifetime control region 550, a mask such as a resist mask or a metal mask is required. Therefore, the semiconductor device 500 may be affected by the mask deviation of the lifetime control region 550.

On the other hand, in the semiconductor device 100 according to the embodiment, since the lifetime control region 150 is provided in the transistor portion 70 and the diode portion 80, the mask deviation can be avoided. In addition, since it is not necessary to form a mask for forming the lifetime control region 150, the process step can be simplified. In the semiconductor device 100, holes are uniformly removed at the time of turn-off, and the carrier balance between the transistor portion 70 and the diode portion 80 is improved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate
12: emitter region
14: base region
15: contact region
16: accumulation region
17: well region
18: drift region
19: plug region
20: buffer region
21: front surface
22: collector region
23: back surface
24: collector electrode
25: connection portion
30: dummy trench portion
31: extending portion
32: dummy dielectric film
33: connection portion
34: dummy conductive portion
38: interlayer dielectric film
40: gate trench portion
41: extending portion
42: gate dielectric film
43: connection portion
44: gate conductive portion
45: gate runner
50: gate metal layer
52: emitter electrode
54: contact hole
55: contact hole
56: contact hole
70: transistor portion
71: mesa portion
80: diode portion
81: mesa portion
82: cathode region
90: boundary portion
91: mesa portion
100: semiconductor device
101: curve 102: curve
150: lifetime control region
160: lifetime control region
500: semiconductor device
516: accumulation region
550: lifetime control region
560: lifetime control region
570: transistor portion
580: diode portion

What is claimed is:

1. A semiconductor device having a transistor portion and a diode portion, comprising:
    a drift region of a first conductivity type provided in a semiconductor substrate;
    an accumulation region of a first conductivity type provided on a front surface side of the semiconductor substrate with respect to the drift region in the transistor portion and the diode portion; and
    a first lifetime control region provided closer to a front surface than to a back surface of the semiconductor substrate and across an entirety of the semiconductor substrate.

2. The semiconductor device according to claim 1, comprising:
    a second lifetime control region provided on an entire back surface side of the semiconductor substrate.

3. The semiconductor device according to claim 1, comprising:
    a plurality of trench portions provided in the front surface of the semiconductor substrate,
    wherein a depth of the first lifetime control region is deeper than depths of the plurality of trench portions.

4. The semiconductor device according to claim 1, wherein a depth of the accumulation region is within trench depths of a plurality of trench portions.

5. The semiconductor device according to claim 1, wherein a depth of the first lifetime control region is deeper than twice a depth of a boundary between the accumulation region and the drift region.

6. The semiconductor device according to claim 1, wherein a depth of the first lifetime control region ranges from 5 µm to 20 µm.

7. The semiconductor device according to claim 1, wherein a dose amount of a lifetime killer in the first lifetime control region ranges from 0.5E10 cm$^{-2}$ to 1E13 cm$^{-2}$.

8. The semiconductor device according to claim 7, wherein the first lifetime control region is implanted from a back surface side of the semiconductor substrate.

9. The semiconductor device according to claim 1, wherein the accumulation region includes:
    a first accumulation region provided closer to the front surface side than the drift region; and
    a second accumulation region provided below the first accumulation region.

10. The semiconductor device according to claim 1, wherein a dose amount of ion implantation in the accumulation region ranges from 1E12 cm$^{-2}$ to 1E13 cm$^{-2}$.

11. The semiconductor device according to claim 1, wherein a depth of the accumulation region ranges from 1 µm to 5 µm.

12. The semiconductor device according to claim 1, wherein the transistor portion includes:
    an emitter region of a first conductivity type having a higher doping concentration than the drift region, and
    wherein the accumulation region is provided in a wider range than a region, in a plan view, where the emitter region is provided.

13. The semiconductor device according to claim 1, wherein the transistor portion includes:
    a boundary portion adjacent to the diode portion; and
    a dummy trench portion electrically connected to an emitter electrode, and
    wherein a trench portion at the boundary portion is the dummy trench portion.

14. The semiconductor device according to claim 13, wherein the boundary portion includes:
    the accumulation region;
    a base region of a second conductivity type provided on the front surface side;
    a contact region provided on the front surface side of the base region and having a higher doping concentration than the base region; and
    a plug region of a second conductivity type provided on a front surface side of the contact region and having a higher doping concentration than the contact region.

15. The semiconductor device according to claim 13, wherein the boundary portion does not include an emitter region.

16. The semiconductor device according to claim 9, wherein a dose amount of the first accumulation region and a dose amount of the second accumulation region are identical, and a sum of the dose amounts of the first accumulation region and the second accumulation region ranges from 1E12 cm$^{-2}$ to 1E13 cm$^{-2}$.

17. The semiconductor device according to claim 1, wherein
    a distance in a depth direction of the semiconductor substrate between the accumulation region and the first lifetime control region is equal to or larger than a distance in the depth direction from the front surface of the semiconductor substrate to a lower end of the accumulation region.

18. A manufacturing method of a semiconductor device having a transistor portion and a diode portion, the method comprising:
    providing a drift region of a first conductivity type in a semiconductor substrate;
    providing an accumulation region of a first conductivity type on a front surface side of the semiconductor substrate with respect to the drift region in the transistor portion and the diode portion; and
    providing a first lifetime control region closer to a front surface than to a back surface of the semiconductor substrate and across an entirety of the semiconductor substrate.

19. The manufacturing method according to claim 18, wherein the providing of the first lifetime control region includes irradiating impurities from a back surface side of the semiconductor substrate.

20. The manufacturing method according to claim 18, wherein the providing of the first lifetime control region includes implanting impurities at a dose amount ranging from 0.5E10 cm$^{-2}$ to 1E13 cm$^{-2}$.

21. The manufacturing method according to claim 18, wherein the providing of the accumulation region includes performing ion implantation at a dose amount ranging from 3E12 cm$^{-2}$ to 6E12 cm$^{-2}$.

22. The manufacturing method according to claim 18, wherein
    a distance in a depth direction of the semiconductor substrate between the accumulation region and the first lifetime control region is equal to or larger than a distance in the depth direction from the front surface of the semiconductor substrate to a lower end of the accumulation region.

23. The manufacturing method according to claim 18, wherein the accumulation region includes:
a first accumulation region provided closer to the front surface side than the drift region; and
a second accumulation region provided below the first accumulation region, and
a dose amount of the first accumulation region and a dose amount of the second accumulation region are identical, and a sum of the dose amounts of the first accumulation region and the second accumulation region ranges from $1E12$ $cm^{-2}$ to $1E13$ $cm^{-2}$.

24. A semiconductor device having a transistor portion and a diode portion, comprising:
a drift region of a first conductivity type provided in a semiconductor substrate;
an accumulation region of a first conductivity type provided on a front surface side of the semiconductor substrate with respect to the drift region in the transistor portion and the diode portion; and
a first lifetime control region provided on the front surface side of the semiconductor substrate in the transistor portion and the diode portion,
wherein the accumulation region includes:
a first accumulation region provided closer to the front surface side than the drift region; and
a second accumulation region provided below the first accumulation region, and
wherein a dose amount of the first accumulation region and a dose amount of the second accumulation region are identical, and a sum of the dose amounts of the first accumulation region and the second accumulation region ranges from $1E12$ $cm^{-2}$ to $1E13$ $cm^{-2}$.

* * * * *